United States Patent
Nakamura et al.

[11] Patent Number: 5,838,543
[45] Date of Patent: Nov. 17, 1998

[54] RADIO FREQUENCY POWER AMPLIFICATION MODULE

[75] Inventors: Morio Nakamura, Katano; Masahiro Maeda, Osaka, both of Japan

[73] Assignee: Matsushita Electric Industrial Co., Ltd., Osaka, Japan

[21] Appl. No.: 812,484

[22] Filed: Mar. 6, 1997

[30] Foreign Application Priority Data

Mar. 6, 1996 [JP] Japan ................................ 8-048584
Mar. 19, 1996 [JP] Japan ................................ 8-062362

[51] Int. Cl.⁶ .................................................. H05K 7/20
[52] U.S. Cl. .................. 361/704; 361/704; 361/707; 361/709; 361/712; 361/713; 361/719; 361/720; 257/717; 257/718; 257/719; 174/16.3; 174/52.4; 165/80.2; 165/80.3
[58] Field of Search ............................. 361/704, 707, 361/709, 711, 712, 719, 720; 257/718, 719, 720; 174/16.3, 52.4; 165/80.2, 80.3, 185

[56] References Cited

U.S. PATENT DOCUMENTS 5,184,283 2/1993 Hamel ................................ 174/16.3
5,502,618 3/1996 Chiou ................................ 361/695
5,546,275 8/1996 Moutrie et al. ..................... 361/707
5,675,474 10/1997 Nagase et al. ..................... 361/704

FOREIGN PATENT DOCUMENTS 60-62197 4/1985 Japan .

OTHER PUBLICATIONS

S. Morimoto et al., "GaAs High Power Amplifier Module for digital Portable Radios of Multi–Channel Access System", National Technical Report, vol. 42, No. 6, Dec. 1996, pp. 702–707 partial English translation and English abstract).

Primary Examiner—Leo P. Picard
Assistant Examiner—Boris L. Chervinsky
Attorney, Agent, or Firm—Ratner & Prestia

[57] ABSTRACT

A radio frequency power amplification module includes: a radiation section; a printed circuit board attached to the radiation section; a semiconductor device for power amplification, mounted on the printed circuit board; and a cap. The radiation section includes a plurality of radiation boards, the plurality of radiation boards at least including a first radiation board as a lowermost layer, and a second radiation board attached onto the first radiation board, the first radiation board being coupled to the cap.

23 Claims, 12 Drawing Sheets

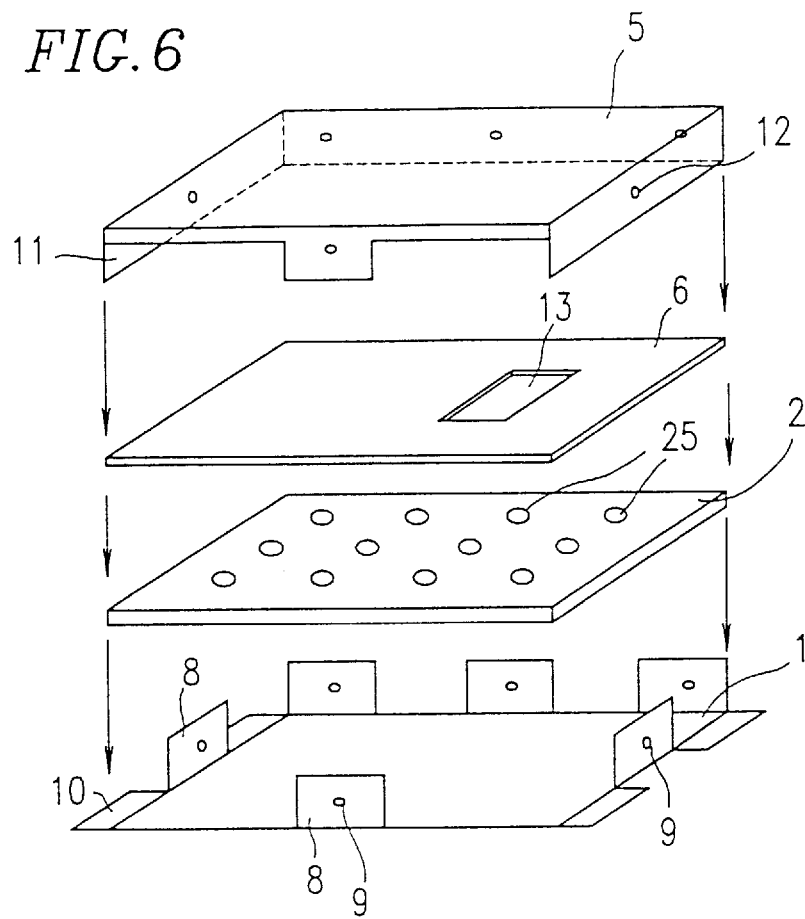

PRIOR ART

PRIOR ART ed5,838,543

RADIO FREQUENCY POWER AMPLIFICATION MODULE

BACKGROUND OF THE INVENTION

1. Field of the Invention

The present invention relates to a radio frequency (high frequency) power amplification module including a radio frequency (high frequency) power amplification circuit incorporating semiconductor devices for power amplification and various chip components.

2. Description of the Related Art

In recent years, there has been an increasing demand for radio frequency (RF) power amplification modules operating in the microwave band, due to the prevalence of communication equipment such as mobile phones. Specifically, an RF power amplification module is defined as an RF power amplifier including a semiconductor device for power amplification (e.g., power FET) and chip components (e.g., resistors and/or capacitors) mounted on a printed circuit board bearing micro-strip lines formed thereon.

In the following description, the term "power FET" will be used for conciseness to represent a power semiconductor device for power amplification employed in such an RF power amplification module.

An RF power amplification module is used for the transmitter of mobile communication equipment such as a mobile phone. Therefore, the properties of the RF power amplification module, e.g., shape, efficiency, etc. are critical to various factors of the mobile communication equipment, e.g., size, maximum length of talk time, etc. Furthermore, the RF power amplification module is one of the most power-consuming components among all the components incorporated in communication equipment, and therefore, radiation of heat (hereinafter, also referred to simply as "radiation") from the RF power amplification module has always been an important issue.

In this specification, the phrase "radiation of heat" or "radiation" is used for expressing the similar meaning with the phrase "heat dissipation".

A generally employed method for improving the radiation of an RF power amplification module is to solder a printed circuit board of the RF power amplification module on a metal radiation board, the entire RF power amplification module being further accommodated (i.e., enclosed or covered) by a metal cap.

FIGS. 9A and 9B are a cross-sectional view and an exploded perspective view, respectively, showing an exemplary configuration of a conventional RF power amplification module. FIG. 9A shows a cross section taken at line 9A—9A' in FIG. 9B.

In the illustrated RF power amplification module, a printed circuit board 106, on which circuit components are mounted, is soldered onto a radiation board 101. A power FET 107 used in the output stage of the module, which consumes a particularly large amount of power among all the circuit components employed, is directly soldered onto the radiation board 101 via a through hole 113 provided in the printed circuit board 106 for increased radiation. The thickness of the radiation board 101 must be relatively large in order to improve the radiation characteristics of the RF power amplification module.

Furthermore, the radiation board 101 is attached to a metal cap 105, which is disposed so as to enclose or cover the circuit components, etc. mounted on the printed circuit board 106. Specifically, the attachment between the metal cap 105 and the radiation board 101 is achieved through the engagement of a hook 123 of the metal cap 105 into a groove 124 on the bottom of the radiation board 101.

Especially in the case where the RF power amplification module is designed to operate in the microwave band, the coupling between the metal cap 105 and the radiation board 101 is important. An unsatisfactory coupling therebetween would result not only in degradation of the radiation, but also in slight differences between the electrical potentials of various portions of the metal cap 105 and the ground potential, thereby unfavorably affecting the RF performance of the RF power amplification module. Therefore, in the RF power amplification module having the configuration shown in FIGS. 9A and 9B, the radiation board 101 is required to be processed at high precision.

The processing of the radiation board 101 can be achieved, for example, by cutting or pressing. In general, the cutting process, which provides excellent precision, is not ideal for mass production because of the high production cost it incurs. On the other hand, pressing process employing molds is excellent for mass production but is inferior in precision. Any attempts to increase the precision of the pressing process for obtaining the radiation boards would result in a large increase in the production cost.

FIGS. 10A and 10B are a cross-sectional view and an exploded perspective view, respectively, showing an exemplary configuration of a conventional RF power amplification module having an intermediate output power level (e.g., output power of about 1W). FIG. 10A shows a cross section taken at line 10A—10A' in FIG. 10B.

In the illustrated RF power amplification module, a printed circuit board 106, on which circuit components are mounted, is soldered onto a radiation board 101. A power FET 107 used in the output stage of the module, which consumes a particularly large amount of power among all the circuit components employed, is directly soldered onto the radiation board 101 via a through hole 113 provided in the printed circuit board 106 for increased radiation. The thickness of the radiation board 101 must be relatively large in order to improve the radiation characteristics of the RF power amplification module.

Furthermore, the radiation board 101 is attached to a metal cap 105, which is disposed so as to enclose or cover the circuit components, etc. mounted on the printed circuit board 106. Specifically, the attachment between the metal cap 105 and the radiation board 101 is achieved through the engagement of bumps 112 provided on bent portions 111 of the metal cap 105 into dents 109 provided on claws 108 of the radiation board 101. The bent portions 111 of the metal cap 105 abut with projections 110 of the radiation board 101.

As the radiation board 101, a processed flat plate typically having a thickness of about 0.3 mm is used. In the case of a conventional RF power amplification module having output power about 1W, the radiation board 101 having such a thickness is sufficient to provide satisfactory radiation effects. However, a further improvement in the radiation characteristics is expected especially for increasing the output power of the RF power amplification module and/or increasing the mounting density of components, which is necessitated by the demand of miniaturization of communication equipment, etc.

Increasing the thickness of the radiation board 101 can effectively improve the radiation characteristics. However, the configuration illustrated in FIGS. 10A and 10B does not allow the thickness of the radiation board 101 to be overly increased because (1) an increased thickness of the radiation board 101 makes it difficult to bend the claws 108; and because (2) an increased thickness of the radiation board 101 adds to the overall size of the RF power amplification module, contrary to the demand of miniaturization, irrespective of whether or not the thickness of the radiation board 101 allows bending of the claws 108.

Advances in the miniaturization of communication equipment require further miniaturization of the RF power amplification modules included therein, and in turn further improvement in the radiation characteristics thereof. However, in the conventional configuration shown in FIGS. 9A and 9B, the processing precision of the radiation board 101 exerts a large influence on the RF characteristics of the RF power amplification module in operation, thereby making it difficult to mass-produce RF power amplification modules which combine both small size and stable operation. On the other hand, in the conventional configuration shown in FIGS. 10A and 10B, it is difficult to improve the radiation characteristics by increasing the thickness of the radiation board 101 because of the problems concerning the processing facility and size of the radiation board 101.

Thus, conventional techniques cannot mass-produce RF power amplification modules which are capable of stable operation while meeting various demands such as miniaturization and improvement in the radiation characteristics.

SUMMARY OF THE INVENTION

A radio frequency power amplification module of the present invention includes: a radiation section; a printed circuit board attached to the radiation section; a semiconductor device for power amplification, mounted on the printed circuit board; and a cap. The radiation section includes a plurality of radiation boards, the plurality of radiation boards at least including a first radiation board as a lowermost layer, and a second radiation board attached onto the first radiation board, the first radiation board being coupled to the cap.

Preferably, the second radiation board is thicker than the first radiation board.

Preferably, the first radiation board includes a resilient material and the second radiation board includes a material having a high thermal conductivity.

In one embodiment, a concave portion is formed in a portion on a surface of the second radiation board corresponding to the mounted semiconductor device for power amplification.

In another embodiment, a through hole is provided in the second radiation board.

In still another embodiment, a groove is formed at one end of the second radiation board.

In still another embodiment, on at least a surface of the second radiation board that is attached onto the first radiation board, at least one end is chamfered.

According to another aspect of the present invention, a radio frequency power amplification module includes: a radiation section including a plurality of radiation boards; a printed circuit board attached to the radiation section; and a semiconductor device for power amplification, mounted on the printed circuit board. A common through hole is provided in the printed circuit board, and one of the plurality of radiation boards that is attached onto the printed circuit board.

According to still another aspect of the present invention, a radio frequency power amplification module includes: a radiation section; a printed circuit board attached to the radiation section; a semiconductor device for power amplification, mounted on the printed circuit board; and a cap. A projection is provided on the radiation section and a projection is provided on the cap, both of the projections having bottom faces at the same level with each other.

Preferably, the radiation section includes a plurality of radiation boards.

According to still another aspect of the present invention, a radio frequency power amplification module includes: a radiation section; a printed circuit board attached to the radiation section; and a semiconductor device for power amplification, mounted on the printed circuit board. A through hole is provided in the printed circuit board, and a projection is provided into the through hole, the projection being available for positioning of the semiconductor device for power amplification during mounting.

Preferably, the radiation section includes a plurality of radiation boards.

According to still another aspect of the present invention, a radio frequency power amplification module includes: a radiation board; a printed circuit board attached to the radiation board; and a semiconductor device for power amplification, mounted on the printed circuit board. A concave portion is formed in a portion on a surface of the radiation board corresponding to the mounted semiconductor device for power amplification.

In this specification, the phrase "radiation board(s)" may also be referred to as "heat sink(s)", and the phrase "radiation section" may also be referred to as "heat sink section".

Thus, in accordance with the present invention, a radiation section of an RF power amplification module is composed of a plurality of radiation boards such that a first radiation board formed of a resilient material is coupled to a metal cap and a second radiation board is formed of a material with a high specific heat and excellent thermal conduction for improved radiation characteristics. Thus, the coupling between the first radiation board formed of a resilient material and the metal cap can be secured for stable RF operation characteristics. By prescribing the thickness of the second radiation board to be large, the radiation characteristics of the RF power amplification module can be improved without increasing the overall size thereof.

Furthermore, according to the present invention, projections are provided with a radiation board and a metal cap, so that the projections are soldered to grounded portions during the mounting of the RF power amplification module. Thus, the metal cap is securely grounded for stable RF operation characteristics. Furthermore, the thermal conduction from the radiation board to the metal cap improves, thereby improving the radiation characteristics of the RF power amplification module.

By composing the radiation section with a plurality of radiation boards and providing a common through hole in a printed circuit board and in a radiation board which is soldered onto the printed circuit board, solder is pooled in the through hole in the radiation board, so that secure soldering is achieved between a semiconductor device for power amplification, e.g., a power FET, and the radiation board. As a result, the radiation characteristics of the RF power amplification module are improved.

Furthermore, when providing a through hole in a printed circuit board included in the RF power amplification module, a portion of the printed circuit board corresponding to at least one side of the through hole is removed so as to obtain a through hole with at least one open side. As a result, the overall size of the RF power amplification module can be reduced. By forming projections in the portion where the printed circuit board has been removed, the power FET can be securely positioned in a predetermined position during assembly. As a result, the variation in RF operation characteristics of the RF power amplification modules is reduced.

By composing the radiation section with a plurality of radiation boards and providing through holes in a radiation board to be soldered onto the printed circuit board, the melted solder flows away in a uniform manner, so that the plurality of radiation boards are securely soldered onto one another. As a result, the radiation characteristics of the RF power amplification module are improved.

By composing the radiation section with a plurality of radiation boards and providing grooves in a radiation board to be soldered onto the printed circuit board, excess solder is prevented from leaking out onto the radiation board to be coupled to the metal cap. As a result, the plurality of radiation boards are securely soldered onto one another, so that the radiation characteristics of the RF power amplification module are improved.

Thus, the invention described herein makes possible advantage of providing a mass-producible RF power amplification module having stable operation while being small in size and having excellent radiation characteristics.

This and other advantages of the present invention will become apparent to those skilled in the art upon reading and understanding the following detailed description with reference to the accompanying figures.

BRIEF DESCRIPTION OF THE DRAWINGS

FIG. 6 is an exploded perspective view showing the configuration of an RF power amplification module according to Example 5.

DESCRIPTION OF THE PREFERRED EMBODIMENTS

Before describing specific examples of the present invention, it will be first described how the inventors were led to the accomplishment of the present invention.

Figure 9A:
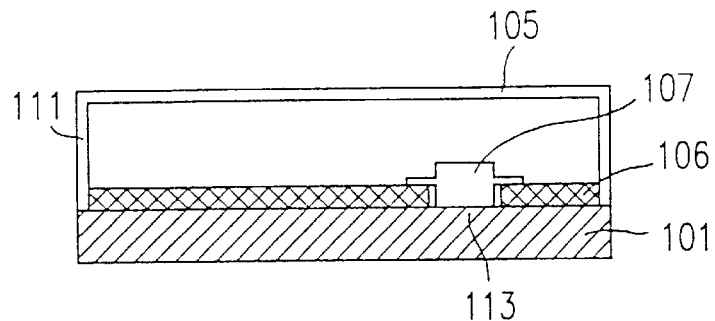
FIG. 9A is a cross-sectional view showing a conventional RF power amplification module.
Figure 9B:
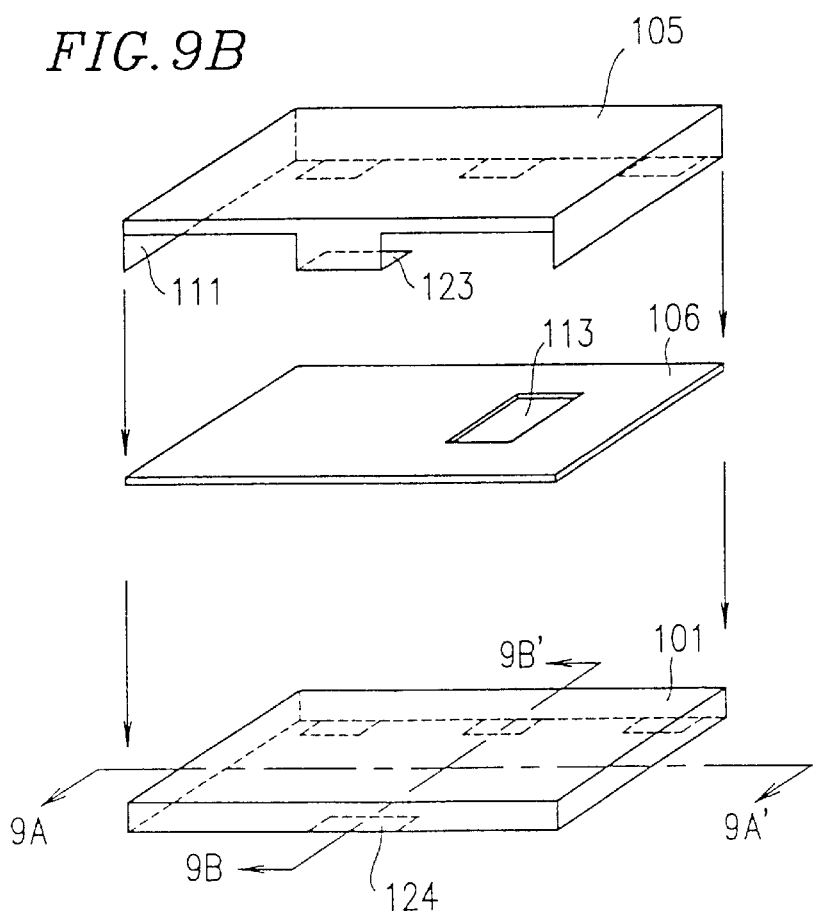
FIG. 9B is an exploded perspective view showing the RF power amplification module shown in FIG. 9A.
Figure 11A:
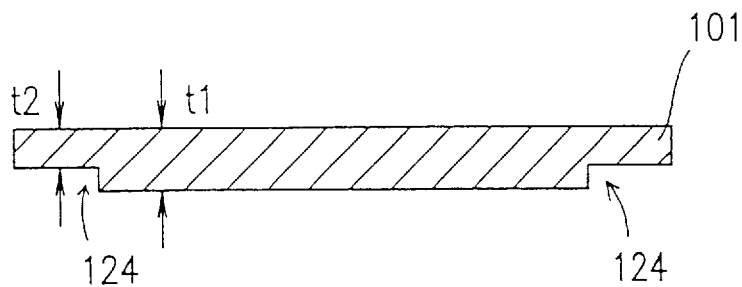
FIG. 11A is a schematic cross-sectional view showing a radiation board included in the RF power amplification module shown in FIGS. 9A and 9B, the radiation board being obtained by a cutting process.
Figure 11B:
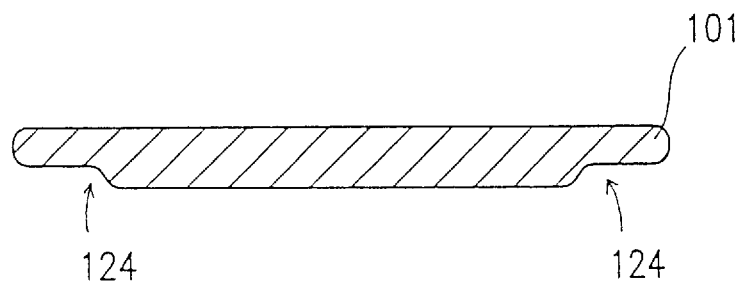
FIG. 11B is a schematic cross-sectional view showing a radiation board included in the RF power amplification module shown in FIGS. 9A and 9B, the radiation board being obtained by a pressing process.

FIGS. 11A and 11B are schematic views showing cross sections (taken at line 9B—9B' in FIG. 9B) of a radiation board 101 obtained by a cutting process and a pressing process, respectively. The radiation board 101 is composed essentially of Cu, designed to have a thickness t1 of 1.0 mm. The radiation board 101 is designed to have a thickness t2 of 0.7 mm in groove portions 124 thereof.

As shown in FIG. 11B, the pressing process tends to provide an insufficient processing precision, as illustrated the grooves 124 becoming gradually thinner toward the ends. This tendency increases as the designed thickness of the groove portions 124 decreases. On the other hand, it will be seen from FIG. 11A that the cutting process provides relatively sufficient processing precision.

Next, the RF operation characteristics of RF power amplification modules constructed by employing the two radiation boards 101 illustrated in FIGS. 11A and 11B are discussed with reference to FIG. 12, which is a graph showing a comparison between the power gains of the respective RF power amplification modules resulting from the different shapes of the radiation boards 101 (which in turn result from the different processing methods, i.e., cutting or pressing).

Figure 12:
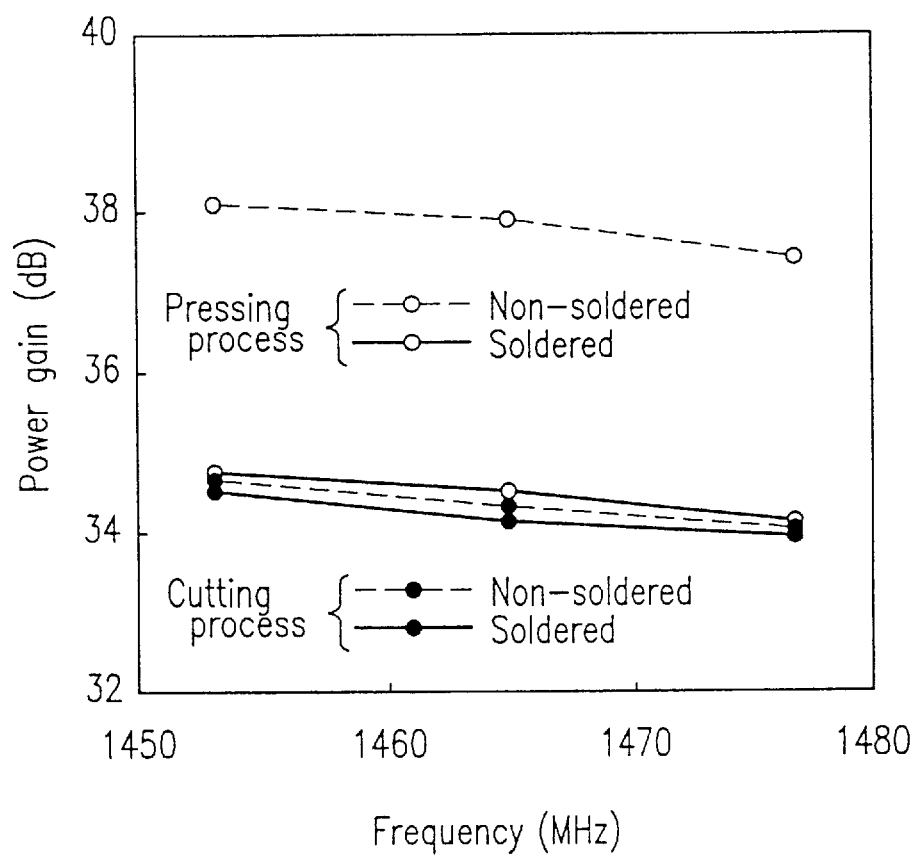
FIG. 12 is a graph showing a difference in the power gains of the RF power amplification module shown in FIGS. 9A and 9B resulting from the different processing methods for the radiation board included therein.

As seen from FIG. 12, the RF power amplification modules incorporating a radiation board 101 formed by cutting (indicated by ●) provide a stable power gain, irrespective of whether or not the metal cap is soldered onto the radiation board 101. However, the RF power amplification module incorporating a radiation board 101 formed by pressing, with the metal cap not being soldered onto the radiation board 101 (indicated by ○ and a broken line), provides a power gain which is higher by 3 dB or more than those of the RF power amplification modules obtained by utilizing a cutting process, which is indicative of a tendency to oscillate. Although not shown in FIG. 12, RF power amplification modules incorporating a radiation board 101 formed by pressing also have intersample variation in power gain.

Also as seen from FIG. 12, the power gain of a RF power amplification module obtained by utilizing a pressing process and reinforcing the attachment between the metal cap and the radiation board 101 through soldering (indicated by ○ and a solid line) can be stabilized substantially to the level attained by RF power amplification modules obtained by utilizing a cutting process. Thus, it has been confirmed that in the conventional RF power amplification module having the configuration illustrated in FIGS. 9A and 9B above, the processing precision of the radiation board 101 has a large influence on the operation characteristics of the RF power amplification module. The requirement for the processing precision of the radiation board 101 is naturally expected to soar with the reduction in size and thickness of the RF power amplification module. Therefore, in the conventional RF power amplification module, it is undesirable in terms of operation characteristics to mass-produce the radiation board 101 through press processes.

Figure 10A:
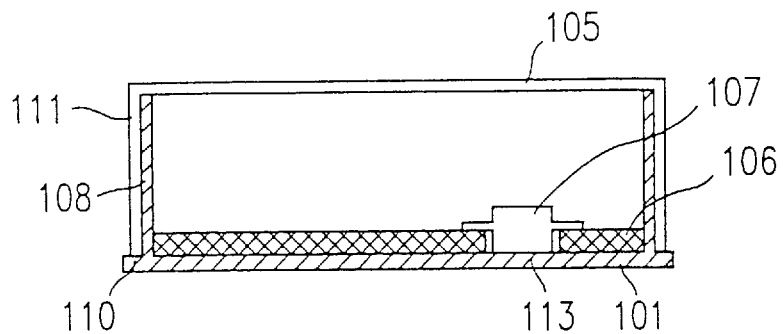
FIG. 10A is a cross-sectional view showing another conventional RF power amplification module.
Figure 10B:
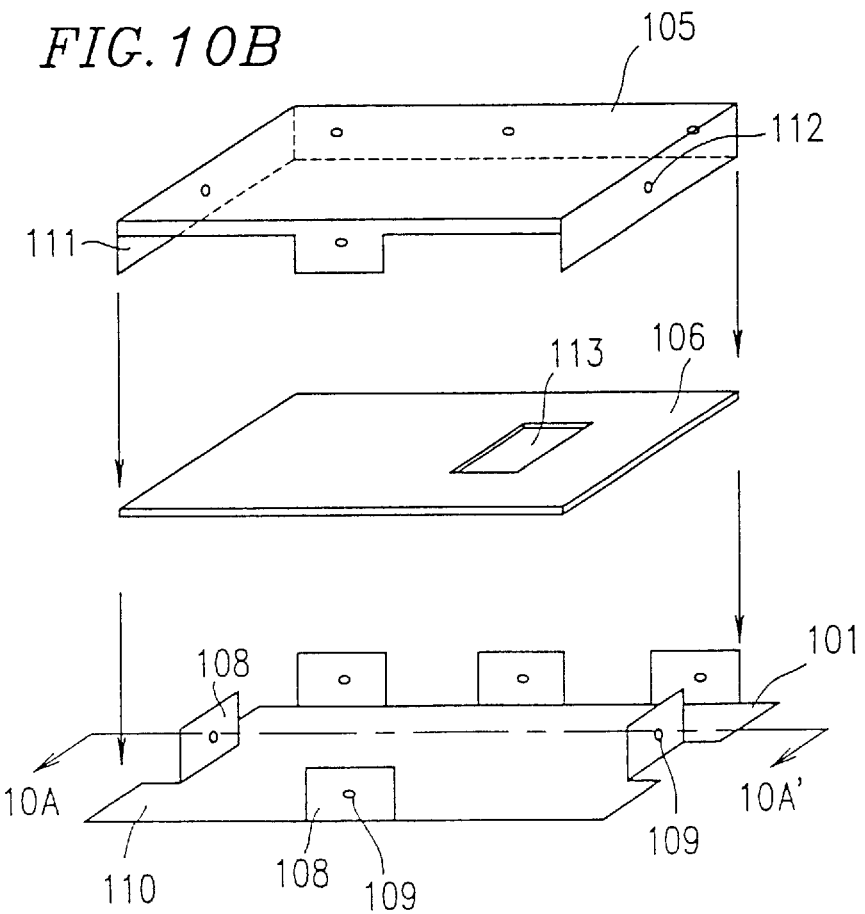
FIG. 10B is an exploded perspective view showing the RF power amplification module shown in FIG. 10A.

On the other hand, the conventional RF power amplification modules illustrated in FIGS. 10A and 10B cannot attain sufficient radiation characteristics due to the constraints in thickness of the radiation board 101 regarding the bending of the claws 108.

Hereinafter, specific examples of RF power amplification modules of the present invention, which are capable of overcoming the above-mentioned problems associated with the prior art, are described with reference to the accompanying figures.

(EXAMPLE 1)

Figure 1A:
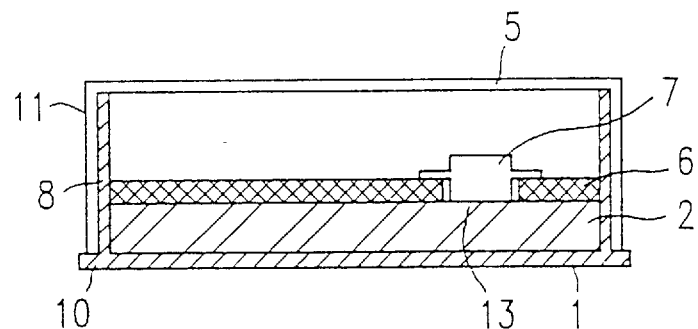
FIG. 1A is a cross-sectional view showing an RF power amplification module according to Example 1 of the present invention.
Figure 1B:
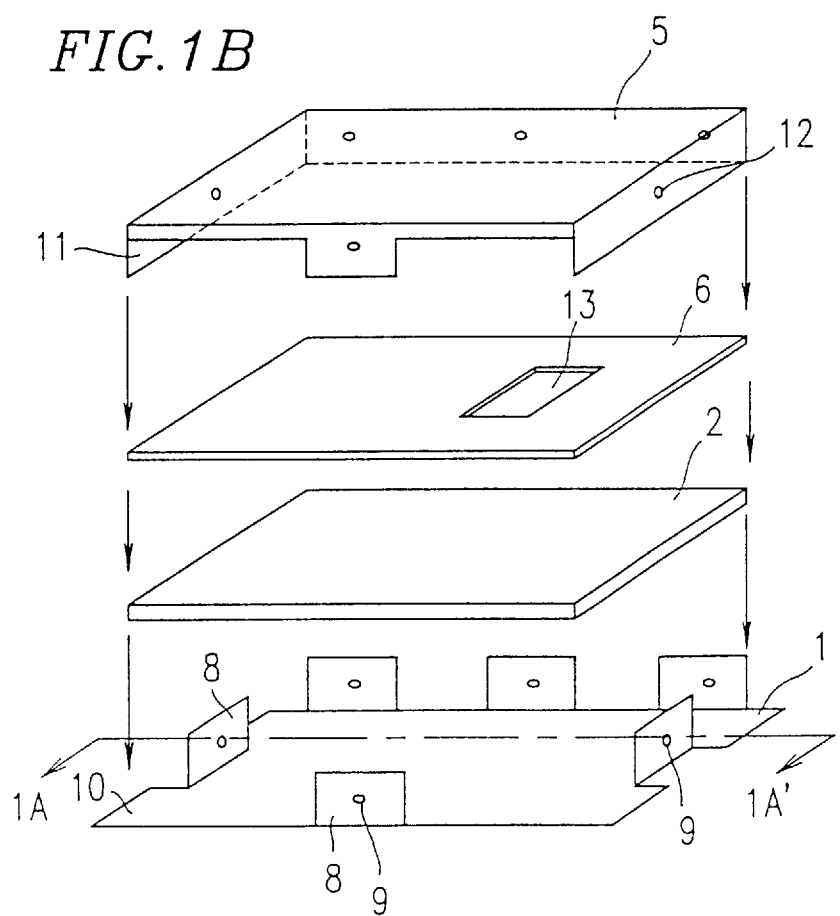
FIG. 1B is an exploded perspective view showing the RF power amplification module shown in FIG. 1A.

FIGS. 1A and 1B are a cross-sectional view and an exploded perspective view, respectively, showing the configuration of a RF power amplification module according to Example 1 of the present invention. FIG. 1A shows a cross section taken at line 1A—1A' in FIG. 1B.

One feature of the present example is the use of two radiation boards, i.e., a first radiation board 1 and a second radiation board 2, which are designed so as to serve their respectively different functions. Specifically, the first radiation board 1 is designed so as to facilitate the coupling with a metal cap 5, whereas the a second radiation board 2 is designed so as to improve the radiation characteristics of the overall RF power amplification module.

In the illustrated RF power amplification module, the first radiation board 1 and the second radiation board 2 disposed on the first radiation board 1 define a radiation section. A printed circuit board 6, on which circuit components are mounted, is soldered onto the second radiation board 2. A power FET 7 used in the output stage of the module, which consumes a particularly large amount of power among all the circuit components employed, is directly soldered onto the second radiation board 2 via a through hole 13 provided in the printed circuit board 6 for increased radiation.

As the first radiation board 1, a flat plate typically having a thickness of about 0.3 mm is used, the plate being processed to have claws 8 having dents 9 provided thereon. Furthermore, the first radiation board 1 is attached to a metal cap 5, which is disposed so as to accommodate therein (i.e., enclose or cover) the circuit components, etc. mounted on the printed circuit board 6. Specifically, the attachment between the metal cap 5 and the first radiation board 1 is achieved through the engagement of bumps 12 provided on bent portions 11 of the metal cap 5 into the dents 9 provided on the claws 8 of the radiation board 1. The bent portions 11 of the metal cap 5 abut with projections 10 of the first radiation board 1. The first radiation board 1 is preferably composed of a resilient material so as to retain sufficient coupling with the metal cap 5. Examples of suitable materials for the first radiation board 1 include nickel silver, stainless steel, titanium (Ti), a Ti alloy, and the like. Typically, the first radiation board 1 can be composed of nickel silver.

In accordance with the above-described configuration, a sufficient contact area is secured between each claw 8 of the first radiation board 1 and each bent portion 11 of the metal cap 5, thereby providing for an excellent coupling between the first radiation board 1 and the metal cap 5. As a result, the RF operation characteristics of the RF power amplification module is stabilized, without variation between products.

Furthermore, for the sake of improved radiation, the second radiation board 2 having a thickness of about 0.7 mm is disposed on the first radiation board 1. In accordance with this configuration, the thickness of the second radiation board 2 can be adjusted to a desired value for improving the radiation characteristics. The second radiation board 2 is preferably composed of a material having excellent thermal conductivity. Examples of suitable materials for the second radiation board 2 include copper (Cu), aluminum (Al), molybdenum (Mo), tungsten (W), various alloys of these materials, and the like. Typically, the second radiation board 2 can be composed of Cu. In certain applications requiring particular light weight, the second radiation board 2 may be formed essentially of Al. It should be noted that the second radiation board 2 is employed as a flat plate, i.e., no high processing-precision standards are required for the formation of the second radiation board 2.

The configuration according to the present example is also suitable for miniaturization of the RF power amplification module, as discussed with reference to FIGS. 2A–2E below (which is directed to an exemplary RF power amplification module including a printed circuit board having a vertical dimension of about 10 mm and a horizontal dimension of about 15 mm).

Figure 2A:
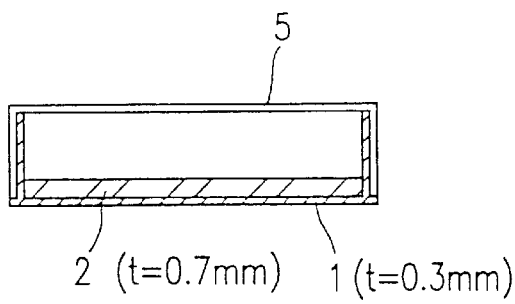
FIG. 2A is a cross-sectional view showing the RF power amplification module shown in FIG. 1A.
Figure 2C:
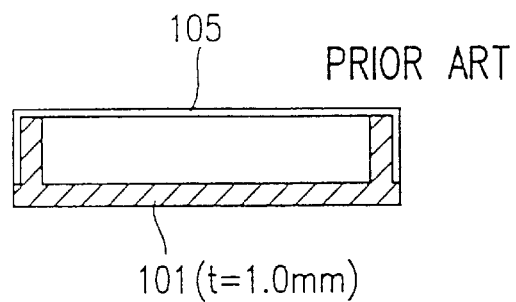
FIG. 2C is a cross-sectional view showing a conventional RF power amplification module.
Figure 2B:
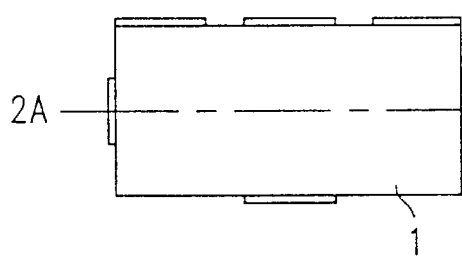
FIG. 2B is a plan view showing the RF power amplification module shown in FIG. 1A.
Figure 2D:
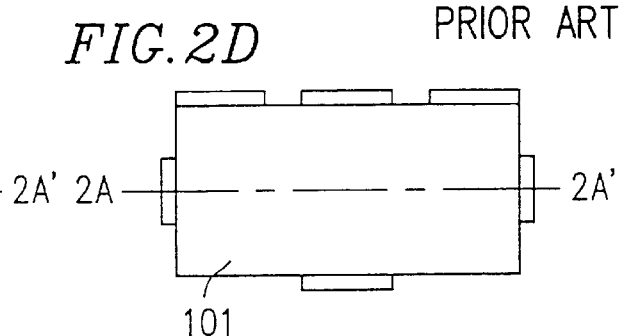
FIG. 2D is a plan-view showing the conventional RF power amplification module shown in FIG. 2C.
Figure 2E:
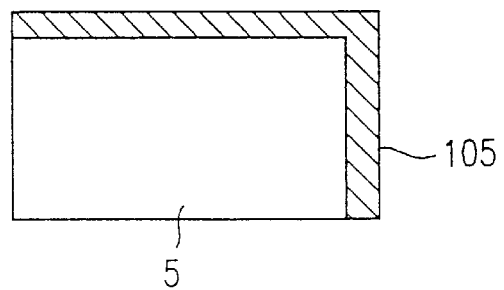
FIG. 2E is a plan view for comparing the sizes and shapes of the radiation boards in the RF power amplification module shown in FIGS. 2A and 2B and the conventional RF power amplification module shown in FIG. 2C and 2D.

FIGS. 2A and 2B are, respectively, a cross-sectional view showing an RF power amplification module according to the present example and a plan view showing the first radiation board 1 included therein. FIGS. 2C and 2D are, respectively, a cross-sectional view showing a conventional RF power amplification module and a plan view showing the first radiation board 1 included therein. FIG. 2E is a diagram illustrating the relative areas occupied by the RF power amplification module and the conventional RF power amplification module with a metal cap 5 or 105 disposed thereon.

As shown in FIGS. 2C and 2D, if the thickness of the radiation board 101 constituted as a single metal plate is increased (for improved radiation) from about 0.3 mm to about 1.0 mm in the conventional RF power amplification module, an increase of about 1.4 mm results in both the vertical dimension and the horizontal dimension of the entire RF power amplification module. As a result, the area occupied by the RF power amplification module including the metal cap 105 increases from about 180 mm$^2$ to about 220 mm$^2$, i.e., 1.2 fold.

In contrast, in accordance with the configuration of the present example shown in FIGS. 2A and 2B, the same radiation level can be attained by the addition of the second radiation board 2 having a thickness of about 0.7 mm, without increasing the thickness of the first radiation board 1. Since the size of the entire RF power amplification module is determined by the size of the first radiation board 1, the area occupied by the outline of the RF power amplification module does not increase.

In addition, in accordance with the configuration of the present example, the RF power amplification module can be easily assembled with high accuracy. That is, the step of mounting the second radiation board 2 and the printed circuit board 6 can be performed by positioning the boards 2 and 6 with reference to the claws 8 of the first radiation board 1, without employing special jigs for assembly in the positioning. Furthermore, the claws 8 of the first radiation board 1 also prevent the boards 2 and 6 from moving while the solder is still in a melted state in a reflow furnace.

It should be noted that the configuration according to the present example does not complicate or add to the number of assembly steps in spite of the increased number of radiation boards. That is, a conventional RF power amplification module is typically assembled by placing a solder plate on the radiation board 101, mounting a printed circuit board (with a matching circuit formed thereon) and a power FET, and introducing the RF power amplification module into a reflow furnace to secure adhesion between the components. On the other hand, the RF power amplification module according to the present example only additionally requires the insertion of the second radiation board 2 (with a solder plate interposed between the first radiation board 1 and the second radiation board 2). By being introduced into a reflow furnace, the first radiation board 1 and the second radiation board 2, the printed circuit board 6, and the power FET 7 can be simultaneously secured. Thus, despite the increased number of radiation boards, (i.e., the first radiation board 1 and the second radiation board 2), the present example does not increase the production cost due to an increased number of assembly steps.

Furthermore, the first radiation board 1 and the second radiation board 2 can be optionally solder plated so as to increase the wettability for solder, thereby further reinforcing the adhesion between the radiation boards 1 and 2.

Moreover, the configuration according to the present example facilitates the mounting of the RF power amplification module onto a mother board of communication equipment, or the like, as follows. In some applications, the mounting of the RF power amplification module onto a mother board is attained by soldering only the projections 10 of the radiation board 1, rather than the entire surface of the radiation board 1, to a grounded portion of the mother board, in order to facilitate a later detachment of the RF power amplification module. In accordance with the conventional configuration, such soldering can be securely made only by heating the entire RF power amplification module because of the good thermal conduction of the relatively thick radiation board 101. In contrast, since the projections 10 of the radiation board 1 according to the present example can be made thin, so that soldering for the above purpose can be achieved through local heating. The soldering can even be achieved by local heating utilizing laser.

As described above, according to the present example, an RF power amplification module which is small in size but excellent in radiation characteristics can be realized by adjusting the thickness of the second radiation board 2. Moreover, the RF coupling between the first radiation board 1 and the metal cap 5 can be achieved even by utilizing a simple pressing process, while reducing the variation in the operation characteristics of the RF power amplification modules. The positioning accuracy of the printed circuit board 6 can be enhanced even with the conventional assembly method. Furthermore, the mounting of the RF power amplification module onto a mother board is facilitated so that soldering is possible through local heating, thereby reducing the thermal stress applied to the RF power amplification module during soldering.

For the above-mentioned reasons, it is possible, according to the present example, to realize a low cost, mass-producible RF power amplification module having stable RF operation characteristics while being small in size and having excellent radiation characteristics.

(EXAMPLE 2)

Figure 3A:
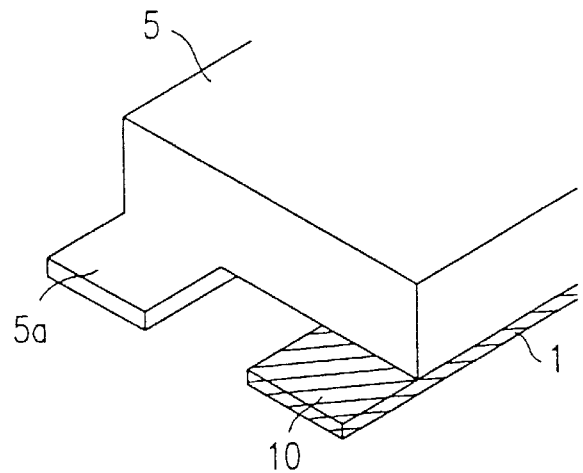
FIG. 3A is a perspective view showing a portion of an RF power amplification module according to Example 2 of the present invention.
Figure 3B:
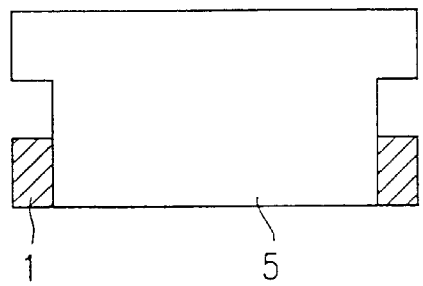
FIGS. 3B, 3C, 3D, and 3E are plan views showing variations of the RF power amplification module shown in FIG. 3A.
Figure 3C:
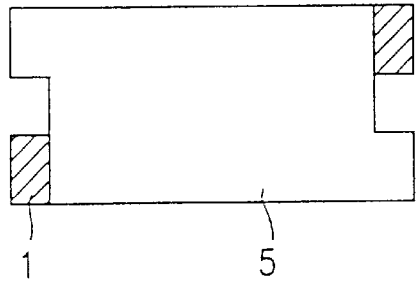
Figure 3D:
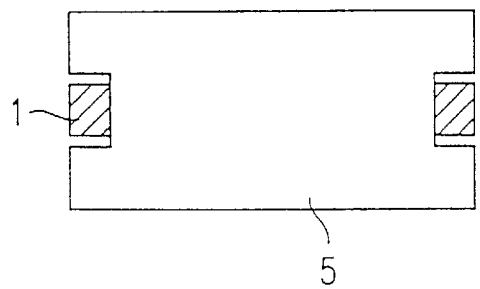
Figure 3E:
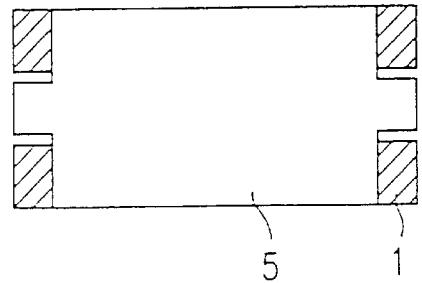

FIG. 3A is a perspective view showing a metal cap 5 for an RF power amplification module according to Example 2 of the present invention.

In Example 1, only the first radiation board 1 is provided with projections 10. In Example 2, the metal cap 5 of Example 2 is also provided with projections 5a, while a first radiation board 1 is provided with projections 10. Like components are indicated by like numerals as used in the above Example, the descriptions thereof being omitted.

When the RF power amplification module is mounted on a mother board, the projections 10 of the first radiation board 1 and the projections 5a of the metal cap 5 are simultaneously soldered to grounded portions of the mother board. Since the metal cap 5 is thus directly soldered to the grounded portions of the mother board, not only the thermal conduction of the metal cap 5 increases thereby further increasing the radiation characteristics, but also an increased RF grounding is attained. Thus, an enhanced shielding is provided for the RF power amplification module, which is very effective in reducing the extraordinary oscillation due to redundant transmission of RF signals and reducing redundant irradiation of RF waves.

FIGS. 3B, 3C, 3D, and 3E are plan views showing variations of the RF power amplification module according to the present example, illustrating different arrangements of the projections 10 and 5a. The metal cap 5 is securely grounded in any of the arrangements of the projections 10 and 5a shown. However, the arrangement shown in FIG. 3C, where the projections 10 of the first radiation board 1 and the projections 5a of the metal cap 5 are disposed diagonally with respect to each other, is especially effective in enhancing the shielding for the metal cap 5.

Since the metal cap 5, as well as the first radiation board 1, is directly soldered to the grounded portions of a mother board, not only that an improvement in the radiation characteristics and a secure grounding are attained, but also the vibration-resistance of the RF power amplification module improves.

Furthermore, when an RF power amplification module including a radiation board 1 and a metal cap 5 that are composed of different materials and/or with different thicknesses is mounted on a mother board, there is a problem in that the RF power amplification module might be mounted obliquely due to the solder starting to melt at different times, which is in turn caused by the different thermal conductivities of the radiation board 1 and the metal cap 5. In contrast, by employing a plurality of radiation boards 1 and 2, it becomes possible to form the first radiation board 1 and the metal cap 5 of the same material and with the same thickness, thereby overcoming the problem.

As described above, according to the present example, the metal cap 5 as well as the first radiation board 1 is directly soldered to the grounded portions of a mother board, so that the thermal conduction from the first radiation board 1 to the metal cap 5 improves, hence improving the radiation characteristics of the module. Furthermore, an enhanced shielding is provided for the RF power amplification module, thereby reducing variation in the operation characteristics and redundant irradiation of RF waves. Furthermore, insufficient mounting to a mother board is substantially prevented, thereby improving the vibration-resistance of the module.

(EXAMPLE 3)

Figure 4A:
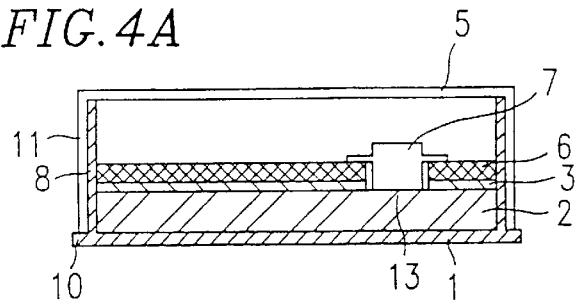
FIG. 4A is a cross-sectional view showing an RF power amplification module according to Example 3 of the present invention.
Figure 4B:
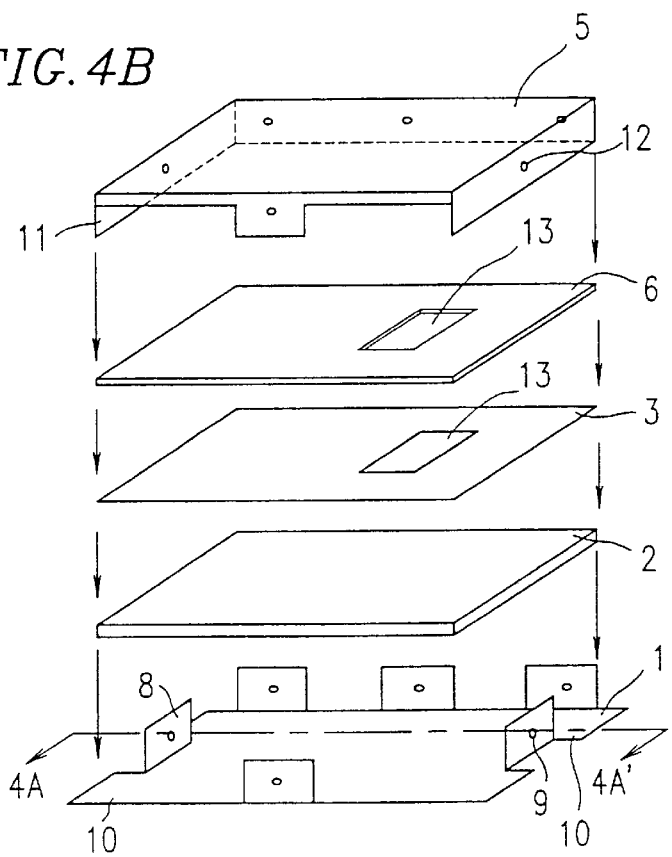
FIG. 4B is an exploded perspective view showing the RF power amplification module shown in FIG. 4A.

FIGS. 4A and 4B are a cross-sectional view and an exploded perspective view, respectively, showing the configuration of an RF power amplification module according to Example 3 of the present invention. FIG. 4A shows a cross section taken at line 4A—4A' in FIG. 4B.

One feature of the present example is the use of a third radiation board 3 in addition to first and second radiation boards 1 and 2. Like components are indicated by like numerals as used in the above Example, the descriptions thereof being omitted.

The third radiation board 3, as well as the second radiation board 2, is formed of a material such as Cu for the sake of improving radiation characteristics. The third radiation board 3 differs from the second radiation board 2 in that the third radiation board 3 is thinner and is provided with a through hole 13 similar to a through hole in a printed circuit board 6. A power FET 7 is directly soldered onto the second radiation board 2 via the through holes 13 provided in the printed circuit board 6 and the third radiation board 3, thereby further improving the radiation characteristics of the module.

Figure 4C:
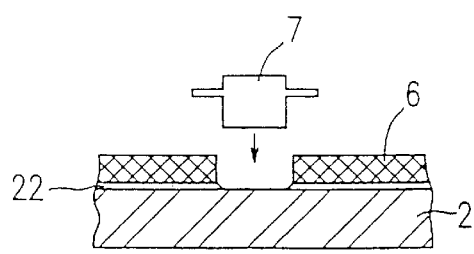
FIGS. 4C and 4D are partial cross-sectional views showing the vicinity of a power FET of the RF power amplification module shown in FIG. 4A.
Figure 4D:
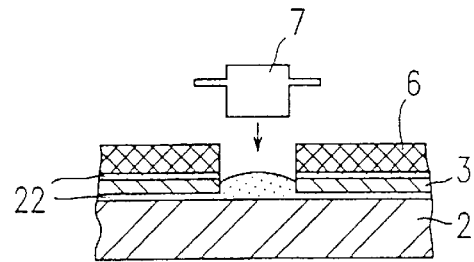

FIGS. 4C and 4D are enlarged cross-sectional views showing the vicinity of the power FET 7. As shown in FIG. 4C, the portion of the radiation board 2 under the printed circuit board 6 typically constitutes a flat plane, so that the solder which has melted during a reflow step may be absorbed under the printed circuit board 6, resulting in insufficient soldering between the bottom face of the power FET 7 and the second radiation board 2. This problem may be overcome by providing a concave portion (e.g., a shallow dent) in a portion of the surface of the radiation board 2 under the printed circuit board 6 corresponding to the power FET 7. This is because some of the solder will be conveniently held in the concave portion, so that sufficient solder exists in the vicinity of the power FET 7 during a reflow step, thereby reinforcing the soldering. However, forming a concave portion of a desired size and shape in a desired position of the radiation board 2 requires a high processing precision, which may increase the production cost of the radiation board 2.

Therefore, according to the present example, the third radiation board 3 having the through hole 13 is employed in conjunction with the second radiation board 2, thereby forming a concave portion in the portion corresponding to the power FET 7 to be mounted. As a result, a pool of solder emerges in the through hole 13 of the third radiation board 3, thereby reinforcing the soldering between the power FET 7 and the second radiation board 2. Thus, the thermal conduction to the second radiation board 2 is enhanced, while reducing assembly faults of semiconductor packages due to insufficient soldering.

As in Example 1, the radiation boards 1, 2, and 3, the printed circuit board 6, and the power FET 7 can be simultaneously secured by being introduced into a reflow furnace while employing solder plates. By optionally solder-plating the third radiation board 3, the adhesion can be further reinforced.

As described above, according to the present example, a concave portion is formed under the power FET 7 by adding a radiation board 3 having the through hole 13, which defines an extension of the through hole 13 of the printed circuit board 6. As a result, a solder pool emerges in convex portion formed by the through hole 13, thereby reinforcing the soldering between the power FET 7 and the second radiation board 2.

Thus, the radiation characteristics of the module are improved, while reducing assembly faults.

(EXAMPLE 4)

Figure 5A:
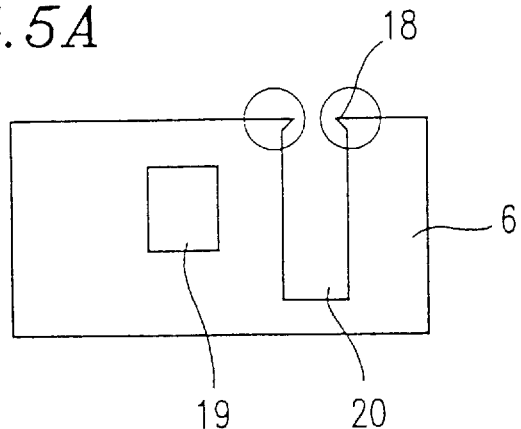
FIGS. 5A to 5C are plan views illustrating the shape of a printed circuit board included in an RF power amplification module according to Example 4 of the present invention.

FIG. 5A is a view describing the outline of a print circuit board 6 for the RF power amplification module according to Example 4 of the present invention.

One feature of the present example is the projections 18 (depicted in the circles in FIG. 5A) provided at the edges of a through hole 20 formed in the printed circuit board 6. The projections 18 are conveniently utilized for the positioning of a power FET (not shown in FIG. 5A) to be mounted.

In order to improve the radiation characteristics of an RF power amplification module, directly soldering a power FET to a radiation board via the through hole 20 in the printed circuit board 6 is very effective. Herein, a "through hole" is defined to include, not only a through hole 19 shown in FIG. 5A, which is completely surrounded by the printed circuit board 6, but also the through hole 20 which is partially open where a portion of the printed circuit board 6 has been removed.

Figure 5B:
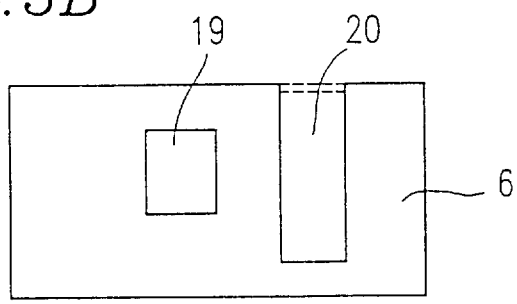

FIG. 5B is a view describing the outline of a print circuit board 6 for an RF power amplification module, including through holes 19 and 20 having different sizes from each other.

The through hole 19 is completely surrounded by the printed circuit board 6 on all sides. However, the size of the through hole increases in the case where two power FETs are provided side by side, e.g., for an increased output power, which may become a bottleneck for the small size of the entire RF power amplification module. Specifically, in the layout shown in FIG. 5B, the size of the through hole dictates the vertical size of the printed circuit board 6.

In contrast, the size of the printed circuit board 6 can be kept relatively small by removing the upper surrounding portion of the printed circuit board 6 above the through hole 20, as shown in FIG. 5B. However, it should be noted that the size of the through hole cannot be designed to be smaller than the size of the power FET(s). If the through hole 20 is smaller than the size of the power FET(s) along its vertical dimension, the power FET(s) inevitably projects from the upper edge of the through hole 20, thereby making it impossible to attach the metal cap thereon. In view of the variation during production of the printed circuit boards 6 and packages of the power FETs, the through hole should be designed with some margin, as indicated by the broken line in FIG. 5B.

However, in the case where the through hole is open on one side, the difficulty in positioning the power FET during the assembly increases relative to the case where the through hole is surrounded by the printed circuit board on all sides. In some cases, an unsecured power FET during a reflow step may shift from the predetermined position, which results in a deviation from the designed wiring length, which in turn results in the degradation of the operation characteristics of the RF power amplification module. Therefore, assembling an RF power amplification module including such a printed circuit board requires an assembly jig for positioning purposes. If one wishes to eliminate the need of such an assembly jig during assembly, a thin strip of the upper portion of the printed circuit board 6 may be left unremoved, as indicated by the broken line above the through hole 20 shown in FIG. 5B.

Figure 5C:
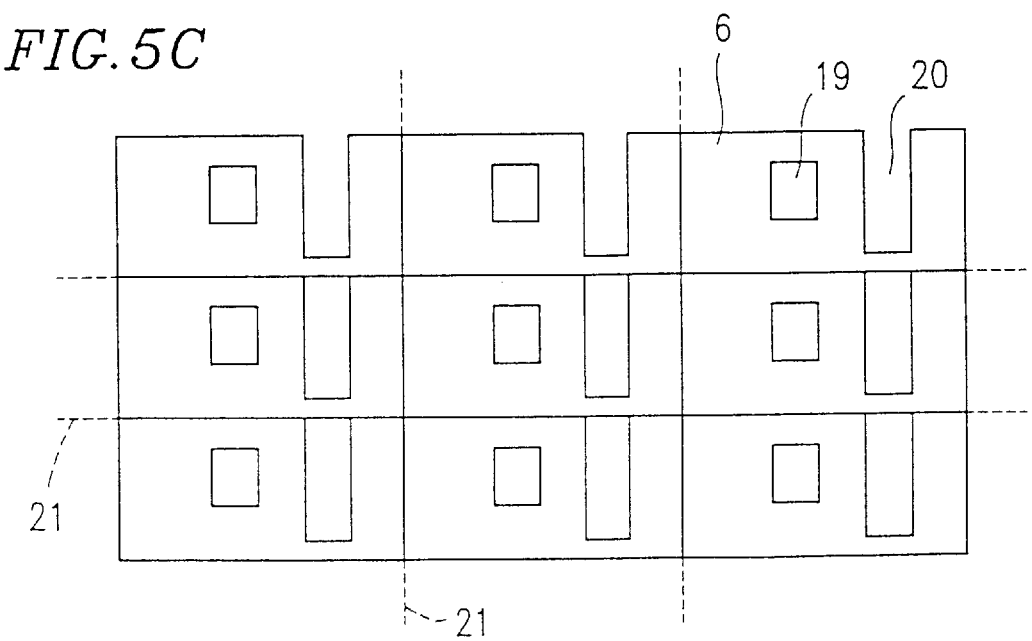

However, the width of such a thin strip of the printed circuit board 6 above the through hole 20 is subject to the constraints described below:

As shown in FIG. 5C, the printed circuit board 6 for an RF power amplification module is generally produced in the form of a collective substrate from which a number of pieces are to be obtained, the pieces being separated from one another at the split lines 21 after chip components are mounted. If the width of the strip of the printed circuit board 6 above the through hole 20 is too small, the printed circuit board 6 may break above the through hole 20 during the splitting process due to insufficient strength therein. In view of the required strength of the printed circuit board 6 during the splitting process, the strip portion of the printed circuit board 6 must at least be about 2 mm wide above and around the through hole 20. However, this causes the size of the printed circuit board 6 to be larger than is desired, thereby hindering the miniaturization of the RF power amplification module.

Therefore, according to the present example, the projections 18 for fixing the position of a relevant semiconductor package (depicted in the circles in FIG. 5A) are provided at the edges of the through hole 20. In this case, the margin to be provided above the through hole 20 is only about 0.2 mm wide, while securing a sufficient strength to withstand the splitting process. As a result, a miniaturized RF power amplification module can be realized without allowing the printed circuit board 6 to be broken during the splitting process.

Since the projections 18 are formed, it is possible to achieve an accurate positioning without requiring a particular assembly jig for positioning purposes. As a result, variation in the operation characteristics among RF power amplification modules can also be reduced.

Although the projections 18 are illustrated as triangular in FIG. 5A, any other shape, e.g., rectangles, arcs, etc. can attain the same effect.

As described above, according to the present example, the through hole 20 provided in the printed circuit board 6 for improving radiation characteristics is formed so as to be open on one side, with the minute projections 18 provided at the edges thereof, whereby the size of the printed circuit board 6 can be reduced. Moreover, the power FET can be accurately positioned during the mounting process without requiring a particular assembly jig for positioning purposes. As a result, variation in the operation characteristics among RF power amplification modules can also be reduced.

(EXAMPLE 5)

FIG. 6 is an exploded perspective view showing the configuration of an RF power amplification module according to Example 5. While the fundamental structure of the RF power amplification module is the same as that of the RF power amplification module according to Example 1, through holes 25 are additionally provided in a second radiation board 2.

In order to improve the radiation characteristics, it is necessary to firmly solder together a plurality of radiation boards. Attaining such a firm soldering requires the solder to be melted in a uniform spread, as well as requiring the amount of solder supplied during assembly to be increased. While increasing the process temperature and/or process time at a reflow furnace during the assembly may prove effective for that purpose, it also has a disadvantage related to the reliability of the products. Increasing the amount of solder, on the other hand, may cause excess solder to flow to the projections 10 of the first radiation board 1. As a result, when the metal cap 5 is attached, the cap 5 may stay off the first radiation board 1 with a small gap therebetween, so that the bumps 12 may not properly engage with the dents 9. In such cases, the operation characteristics of the RF power amplification module may become unstable.

According to the present example, the second radiation board 2 is provided with the through holes 25 for allowing solder to pass through (i.e., for the different purpose from a through hole 13 provided in the printed circuit board 6 which is intended to accept the power FET). By the solder spreading uniformly on both sides of the second radiation board 2 via the through holes 25, any undesired interspace between the radiation boards 1 and 2 is eliminated, thereby further reinforcing the soldering. It also reduces excess solder leaking out.

The through holes 25 are preferably positioned away from the portion in which the power FET is to be mounted. This is because a solder pool in such a portion corresponding to the power FET would enhance the soldering of the power FET and the radiation characteristics. Thus, it is rather preferable for solder to stay at that position without spreading.

As described above, according to the present example, the through holes 25 are provided in the second radiation board 2 so as to firmly solder together a plurality of radiation boards while preventing solder from leaking out from between the radiation boards. As a result, an RF power amplification module having stable operation characteristics can be provided.

(EXAMPLE 6)

Figure 7A:
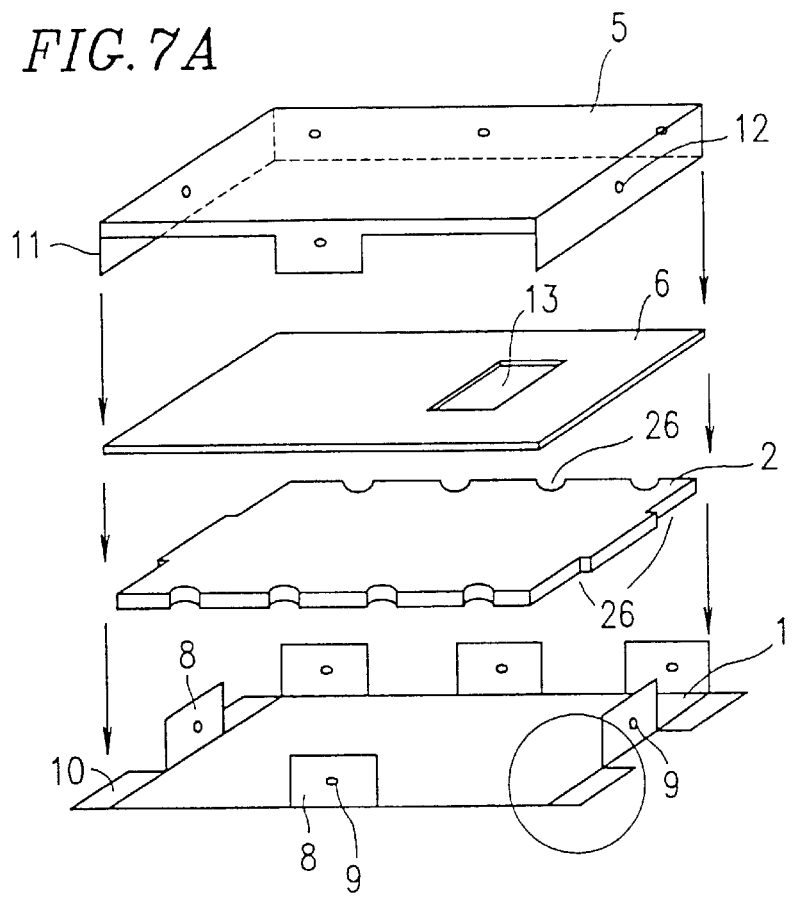
FIG. 7A is an exploded perspective view showing an RF power amplification module according to Example 6 of the present invention.

FIG. 7A is an exploded perspective view showing the configuration of an RF power amplification module according to Example 6. While the fundamental structure of the RF power amplification module is the same as that of the RF power amplification module according to Example 1, grooves 26 are additionally provided at the ends of a second radiation board 2.

As explained in Example 5, in order to improve the radiation characteristics of an RF power amplification module, it is necessary to firmly solder together a plurality of radiation boards, which requires an ample supply of solder while preventing excess solder from leaking into undesirable portions. Accordingly, the grooves 26 are provided at the ends of a second radiation board 2 in the present example so that the excess solder flows through the grooves 26 to spread on both sides of the second radiation board 2. This also reduces the leaking of excess solder to the first radiation board 1.

Figure 7B:
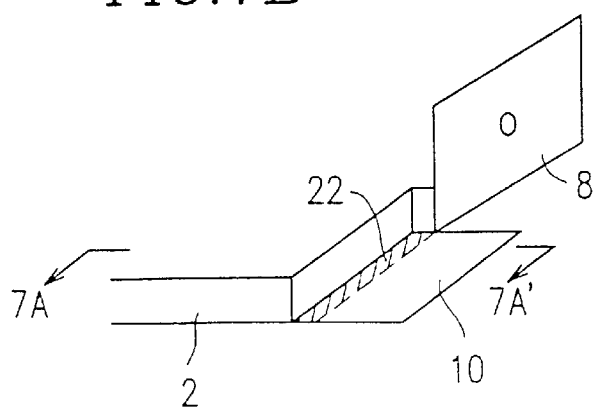
FIG. 7B is a partial perspective view showing a portion of the RF power amplification module shown in FIG. 7A.
Figure 7C:
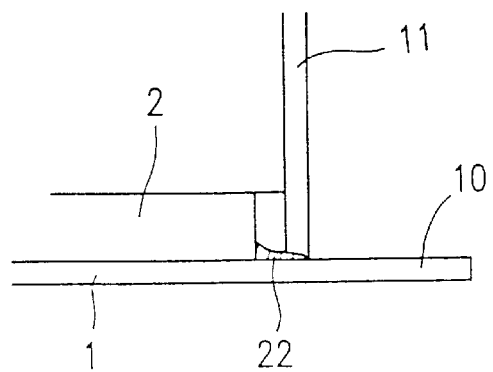
FIG. 7C is a partial cross-sectional view showing a portion of the RF power amplification module shown in FIG. 7A.

FIG. 7B is an enlarged perspective view showing the portion encircled in FIG. 7A. FIG. 7C shows a cross section taken at line 7A—7A' in FIG. 7B. It is preferable to form the grooves 26 along the projections 10 of the radiation board 1 as shown in FIGS. 7B and 7C because the grooves 26 in such positions would not allow leaked solder to affect the attachment of the metal cap 5, thereby further improving the assembly yield of the RF power amplification module.

As described above, according to the present example, a plurality of radiation boards can be more firmly soldered together due to the grooves 26 formed in the second radiation board 2, thereby improving the radiation characteristics. Moreover, assembly faults due to leakage of solder can be reduced.

(EXAMPLE 7)

Figure 8A:
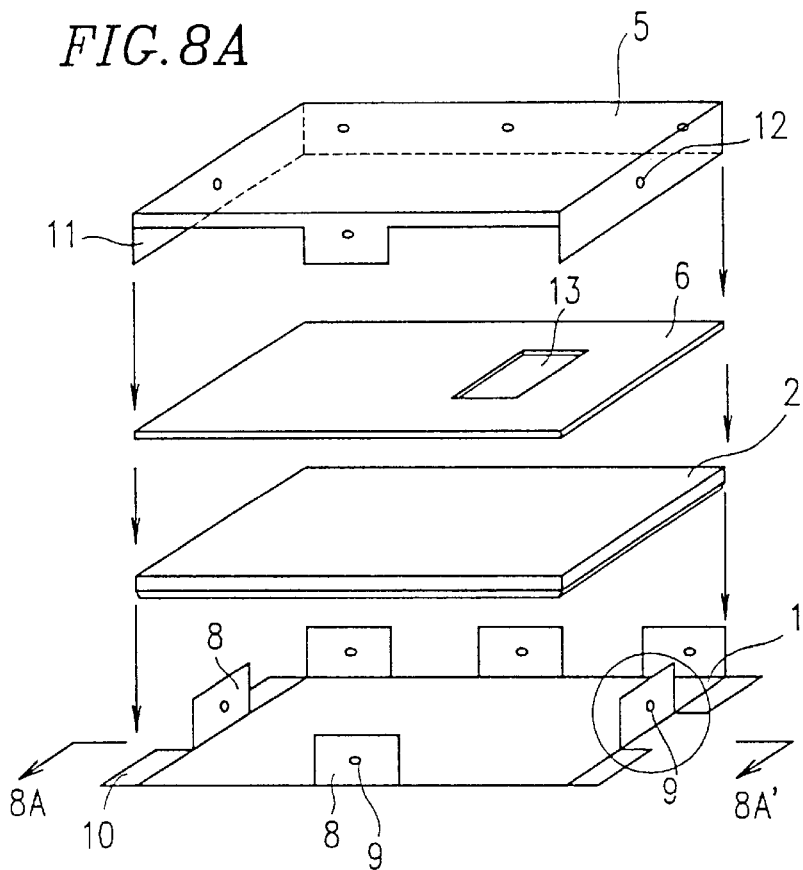
FIG. 8A is an exploded perspective view showing the configuration of an RF power amplification module according to Example 7.

FIG. 8A is an exploded perspective view showing the configuration of an RF power amplification module according to Example 7. While the fundamental structure of the RF power amplification module is the same as that of the RF power amplification module according to Example 1, edges of the second radiation board 2 are chamfered.

Figure 8B:
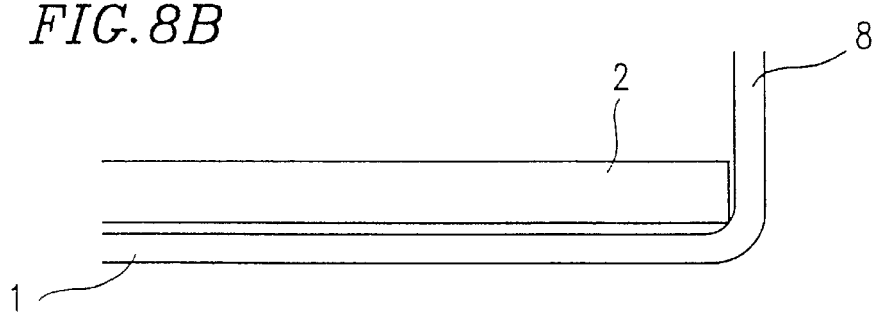
FIGS. 8B and 8C are partial perspective views for describing the configuration of the RF power amplification module shown in FIG. 8A.

The second radiation board 2 is preferably as large as the miniaturization requirement for the entire RF power amplification module allows, in order to improve the radiation characteristics. Accordingly, the second radiation board 2 is designed with dimensions which are very close to acceptable values in view of the inner dimensions of claws 8 of the first radiation board 1. However, such little margin between the second radiation board 2 and the claws 8 may allow an interspace to be created between the second radiation board 2 and the first radiation board 1 after the claws 8 are bent (as shown in FIG. 8B), since the claws 8 are not likely to be bent precisely orthogonally.

Figure 8C:
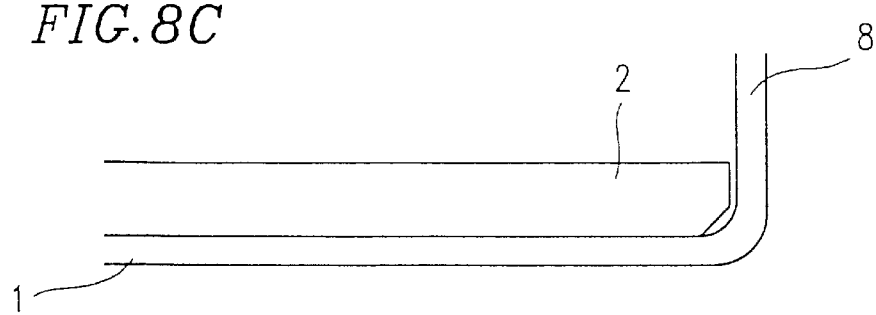

Therefore, according to the present example, at least the edges of the second radiation board 2 on the side that is fixed onto the first radiation board 1 are chamfered to reveal additional faces. As a result, as shown in FIG. 8C, the first radiation board 1 and the second radiation board 2 can be firmly joined together without being influenced by the claws 8, thereby providing stable radiation effects.

The additional faces to be revealed after the chamfering can be planes or curved faces. Since the printed circuit board 6 is fixed onto the second radiation board 2 according to the present invention, the printed circuit board 6 can be designed with little margin without being influenced by the claws 8. Thus, the positioning variation due to the claws 8 is reduced, whereby stable operation characteristics are obtained.

As described above, according to the present example, edges of the second radiation board 2 are chamfered, so that a minor variation occurring in the processing of the packages will not result in the claws 8 influencing the relative positions of the radiation boards 1 and 2, which are successfully attached to each other in close contact. Thus, the RF power amplification modules according to the present example can be stably produced.

As described above, according to the present invention, there is provided an RF power amplification module which is small in size and has excellent radiation characteristics. Thus, the heating of the power FET in the RF power amplification module can be controlled, whereby the operation characteristics of the RF power amplification module can be improved.

Moreover, according to the present invention, the shielding by the metal cap is enhanced so that variation in the operation characteristics is reduced. Furthermore, assembly faults can be reduced so that the mass-producibility of the RF power amplification module is improved.

Furthermore, according to the present invention, the vibration-resistance of the RF power amplification module can be improved, and the mounting of the RF power amplification module onto a mother board is facilitated. As a result, the reliability of the RF power amplification module is improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A radio frequency power amplification module comprising:
   a radiation section;
   a printed circuit board attached to the radiation section;
   a semiconductor device for power amplification, mounted on the printed circuit board; and
   a cap,
   wherein the radiation section includes a plurality of radiation boards, the plurality of radiation boards at least including a first radiation board as a lowermost layer, and a second radiation board attached onto the first radiation board, the first radiation board being coupled to the cap and wherein a common through hole, aligned with the semiconductor device, is provided in the printed circuit board.

2. A radio frequency power amplification module according to claim 1, wherein the second radiation board is thicker than the first radiation board.

3. A radio frequency power amplification module according to claim 1, wherein the first radiation board comprises a resilient material and the second radiation board comprises a material having a high thermal conductivity.

4. A radio frequency power amplification module according to claim 1, wherein a recessed portion is formed in a portion on a surface of the second radiation board which is aligned with the mounted semiconductor device for power amplification.

5. A radio frequency power amplification module according to claim 1, wherein a through hole is provided in the second radiation board.

6. A radio frequency power amplification module according to claim 1, wherein a groove is formed at one end of the second radiation board.

7. A radio frequency power amplification module according to claim 1, wherein on at least a surface of the second radiation board that is attached onto the first radiation board, at least one end is chamfered.

8. A radio frequency power amplification module comprising:
   a radiation section including a plurality of radiation boards;
   a printed circuit board attached to the radiation section; and
   a semiconductor device for power amplification, mounted on the printed circuit board,
   wherein a common through hole aligned with the semiconductor device is provided in the printed circuit board and one of the plurality of radiation boards that is positioned most closely to the printed circuit board.

9. A radio frequency power amplification module comprising:
   a radiation section;
   a printed circuit board attached to the radiation section;

a semiconductor device for power amplification, mounted on the printed circuit board; and a cap, wherein a projection is provided on the radiation section and a projection is provided on the cap, the projections having bottom faces at the same level with each other.

10. A radio frequency power amplification module according to claim 9, wherein the radiation section includes a plurality of radiation boards.

11. A radio frequency power amplification module comprising:

a radiation section;

a printed circuit board attached to the radiation section; and a semiconductor device for power amplification, mounted on the printed circuit board, wherein a through hole is provided in the printed circuit board, the through hole being open on a first side and on the remaining sides the through hole is surrounded by the printed circuit board, and a projection is provided at an edge of the first side of the through hole, the projection being available for positioning of the semiconductor device for power amplification during mounting.

12. A radio frequency power amplification module according to claim 11, wherein the radiation section includes a plurality of radiation boards.

13. A radio frequency power amplification module comprising:

a radiation section;

a printed circuit board attached to the radiation section; and a semiconductor device for power amplification, mounted on the printed circuit board, wherein a recessed portion is formed in a portion on a surface of the radiation section which is aligned with the mounted semiconductor device for power amplification.

14. A radio frequency power amplification module according to claim 8, wherein a first radiation board of the plurality of radiation boards is thicker than a second radiation board of the plurality of radiation boards.

15. A radio frequency power amplification module according to claim 10, wherein a first radiation board of the plurality of radiation boards is thicker than a second radiation board of the plurality of radiation boards.

16. A radio frequency power amplification module according to claim 12, wherein a first radiation board of the plurality of radiation boards is thicker than a second radiation board of the plurality of radiation boards.

17. A radio frequency power amplification module according to claim 8, wherein a first radiation board of the plurality of radiation boards comprises a resilient material and a second radiation board of the plurality of radiation boards comprises a material having a high thermal conductivity.

18. A radio frequency power amplification module according to claim 10, wherein a first radiation board of the plurality of radiation boards comprises a resilient material and a second radiation board of the plurality of radiation boards comprises a material having a high thermal conductivity.

19. A radio frequency power amplification module according to claim 12, wherein a first radiation board of the plurality of radiation boards comprises a resilient material and a second radiation board of the plurality of radiation boards comprises a material having a high thermal conductivity.

20. A radio frequency power amplification module according to claim 13, wherein the radiation section includes a plurality of radiation boards.

21. A radio frequency power amplification module according to claim 20, wherein a first radiation board of the plurality of radiation boards is thicker than a second radiation board of the plurality of radiation boards.

22. A radio frequency power amplification module according to claim 20, wherein a first radiation board of the plurality of radiation boards comprises a resilient material and a second radiation board of the plurality of radiation boards comprises a material having a high thermal conductivity.

23. A radio frequency power amplification module according to claim 9, wherein the projection provided on the radiation section and the projection provided on the cap are separated by a lateral interval.

* * * * *

UNITED STATES PATENT AND TRADE MARK OFFICE
CERTIFICATE OF CORRECTION

PATENT NO.    : 5,838,543
DATED         : November 17, 1998
INVENTOR(S)   : Nakamura et al.

It is certified that error appears in the above-identified patent and that said Letters Patent is hereby corrected as shown below:

On the title page,
item [56] References Cited, U.S. Patent Documents, insert
--5,396,403  3/1995  Patel--.

Signed and Sealed this

First Day of June, 1999

Attest:

Q. TODD DICKINSON

*Attesting Officer*    *Acting Commissioner of Patents and Trademarks*